United States Patent
Lee et al.

(10) Patent No.: US 9,666,602 B2
(45) Date of Patent: May 30, 2017

(54) THIN-FILM TRANSISTOR SUBSTRATE AND METHOD OF MANUFACTURING THE THIN-FILM TRANSISTOR SUBSTRATE

(71) Applicant: Samsung Display Co., LTD., Yongin, Gyeonggi-Do (KR)

(72) Inventors: Ji-Seon Lee, Suwon-si (KR); Dong-Jo Kim, Yongin-si (KR); Yoon-Ho Khang, Yongin-si (KR); Yong-Su Lee, Hwaseong-si (KR); Jong-Chan Lee, Suwon-si (KR)

(73) Assignee: SAMSUNG DISPLAY CO., LTD. (KR)

( * ) Notice: Subject to any disclaimer, the term of this patent is extended or adjusted under 35 U.S.C. 154(b) by 147 days.

(21) Appl. No.: 13/828,990

(22) Filed: Mar. 14, 2013

(65) Prior Publication Data
US 2014/0145177 A1    May 29, 2014

(30) Foreign Application Priority Data
Nov. 23, 2012    (KR) .................. 10-2012-0133875

(51) Int. Cl.
- *H01L 33/08* (2010.01)
- *H01L 27/12* (2006.01)
- *H01L 29/786* (2006.01)

(52) U.S. Cl.
CPC ........ *H01L 27/1225* (2013.01); *H01L 27/124* (2013.01); *H01L 27/1222* (2013.01); *H01L 29/7869* (2013.01); *H01L 29/78696* (2013.01)

(58) Field of Classification Search
CPC ............. H01L 27/1222; H01L 27/1225; H01L 27/124; H01L 29/7869; H01L 29/78696

USPC .............................................. 257/43; 438/34
See application file for complete search history.

(56) References Cited

U.S. PATENT DOCUMENTS

| | | | | |
|---|---|---|---|---|
| 4,723,838 A * | 2/1988 | Aoki | ..................... | G02F 1/1368 257/353 |
| 4,768,080 A * | 8/1988 | Sato | .................. | H01L 21/28273 257/316 |
| 5,763,904 A * | 6/1998 | Nakajima | ......... | H01L 21/28512 257/347 |
| 6,867,428 B1* | 3/2005 | Besser | ................ | H01L 29/1054 257/18 |
| 7,667,385 B2* | 2/2010 | Lee | ...................... | H01L 27/3262 313/498 |
| 2004/0247876 A1* | 12/2004 | LaFave | ................. | B32B 37/025 428/411.1 |
| 2010/0084653 A1* | 4/2010 | Yamazaki | ........... | H01L 27/0266 257/43 |
| 2011/0121302 A1* | 5/2011 | Lee | ...................... | H01L 27/3262 257/59 |

(Continued)

FOREIGN PATENT DOCUMENTS

KR          1051586         7/2011

*Primary Examiner* — William F Kraig
*Assistant Examiner* — Edward Chin
(74) *Attorney, Agent, or Firm* — Innovation Counsel LLP (57) ABSTRACT

A thin film transistor substrate includes the following elements: a base substrate, a data line disposed on the base substrate, a source electrode contacting the data line, a drain electrode spaced from the source electrode, a channel disposed between the source electrode and the drain electrode, a pixel electrode electrically connected to the drain electrode, a gate insulation pattern disposed on the channel, and a gate electrode disposed on the gate insulation pattern.

8 Claims, 6 Drawing Sheets

(56) References Cited

U.S. PATENT DOCUMENTS

| | | | |
|---|---|---|---|
| 2013/0200404 A1* | 8/2013 | Lee | H01L 27/156 257/88 |
| 2014/0061632 A1* | 3/2014 | Lee | H01L 29/78633 257/43 |
| 2015/0014677 A1* | 1/2015 | Jo | H01L 29/7869 257/43 |

* cited by examiner

THIN-FILM TRANSISTOR SUBSTRATE AND METHOD OF MANUFACTURING THE THIN-FILM TRANSISTOR SUBSTRATE

PRIORITY STATEMENT

This application claims benefit of and priority under 35 U.S.C. §119 to Korean Patent Application No. 10-2012-0133875, filed on Nov. 23, 2012 in the Korean Intellectual Property Office (KIPO), the contents of which are incorporated herein by reference.

BACKGROUND

1. Field of the Invention

The present invention is related to thin-film transistor substrate and a method of manufacturing the thin-film transistor substrate. The thin-film transistor substrate may be used in one or more of a display apparatus, a circuit substrate, a semiconductor, etc.

2. Description of the Related Art

Generally, a thin film transistor for controlling a pixel in a display apparatus includes a gate electrode, a source electrode, a drain electrode, and an active pattern forming a channel between the source electrode and the drain electrode. The active pattern includes a channel layer including amorphous silicon, poly silicon, or an oxide semiconductor.

Conventionally, if a thin film transistor substrate has a top-gate structure, at least two contact holes may be required for connecting a data line with a pixel.

The requirement of at least two contact holes may be undesirable, especially for a high-resolution display apparatus that requires small pixels. For example, the requirement of at least two contact holes may lead to an undesirably low aperture ratio of the pixels.

SUMMARY

One or more embodiments of the present invention may be related to a thin film transistor substrate for use in a high-resolution panel (e.g., a super-resolution panel).

One or more embodiments of the present invention may be related to a method of manufacturing the thin film transistor substrate.

One or more embodiments of the present invention may be related to a thin film transistor substrate that includes the following elements: a base substrate, a data line disposed on the base substrate and configured to transmit a data signal, a source electrode (directly) contacting the data line, a drain electrode spaced from the source electrode, a channel disposed between the source electrode and the drain electrode, a pixel electrode electrically connected to the drain electrode, a gate insulation pattern disposed on the channel, and a gate electrode disposed on the gate insulation pattern. In the thin film transistor substrate, only one contact hole may be required for each pixel. Advantageously, the aperture ratio of each pixel may be sufficiently large to provide satisfactory image quality. In the thin film transistor substrate, the source electrode, the drain electrode, and the pixel electrode may be in a same layer and may be formed in a same process using a same mask. Therefore, manufacturing of the thin film transistor substrate may be simplified. Advantageously, manufacturing cost and manufacturing time for the thin film transistor substrate may be minimized.

In an embodiment, the source electrode, the drain electrode, and the channel may be disposed in a same layer.

In an embodiment, at least one of the source electrode, the drain electrode, the channel and the pixel electrode may include a metal oxide, and the metal oxides includes at least one of zinc oxide (ZnO), zinc tin oxide (ZTO), zinc indium oxide (ZIO), indium oxide (InO), titanium oxide (TiO), indium gallium zinc oxide (IGZO), indium zinc tin oxide (IZTO), etc.

In an embodiment, the thin film transistor substrate may further include a gate line electrically connected to the gate electrode and configured to transmit a gate signal, and the gate electrode may extend from the gate line and/or may extend parallel to the data line.

In an embodiment, the thin film transistor substrate may further include a light-blocking pattern disposed between the channel and the base substrate, and the thin film transistor substrate may further include a buffer layer disposed between the light-blocking pattern and the channel. The source electrode and the data line may be directly connected to each other through a contact hole of the buffer layer.

In an embodiment, the data line and the light-blocking pattern may be disposed in a same layer.

In an embodiment, the light-blocking pattern may include at least one of silicon-germanium alloy, germanium, and titanium oxide.

In an embodiment, the thickness of the light-blocking pattern may be in a range from about 1000 Å to about 2,000 Å.

In an embodiment, the thin film transistor substrate may further include a passivation layer formed in a same layer as the pixel electrode, and the passivation layer includes an opening through which at least a portion of the pixel electrode is exposed.

One or more embodiments of the present invention may be related to a method of manufacturing a thin film transistor substrate. The method may include the following steps: forming a data line on a base substrate; forming a data insulation layer on the data line, wherein the data insulation layer exposes a portion of the data line; forming a semiconductor layer on the data insulation layer; patterning the semiconductor layer to form a semiconductor pattern that contacts the data line; forming a gate insulation pattern the semiconductor pattern; forming a gate electrode on the gate insulation pattern, wherein at least one of the gate insulation pattern and the gate electrode covers a first portion of the semiconductor pattern without covering a second portion of the semiconductor pattern; and processing the second portion of the semiconductor pattern to form a source electrode that (directly) contacts the portion of the data line, a drain electrode that is spaced from the source electrode, and a pixel electrode that is electrically connected to the drain electrode. In the method, the source electrode, the drain electrode, and the pixel electrode may be formed in a same process using a same mask. Therefore, manufacturing of the thin film transistor substrate may be simplified. Advantageously, manufacturing cost and manufacturing time for the thin film transistor substrate may be minimized.

In an embodiment, a light-blocking pattern may be formed on the base substrate before the data insulation layer is formed, wherein the light-blocking pattern may overlap the gate electrode.

In an embodiment, a buffer layer may be formed on the data insulation layer before the semiconductor layer is formed.

In an embodiment, the buffer layer and the data insulation layer may be patterned to form a contact hole for exposing the portion of the data line.

In an embodiment, a light-blocking pattern may be formed after the buffer layer is formed, wherein the light-blocking pattern may overlap the gate electrode.

In an embodiment, the semiconductor layer may include a metal oxide, and the metal oxides may comprise at least one of zinc oxide (ZnO), zinc tin oxide (ZTO), zinc indium oxide (ZIO), indium oxide (MO), titanium oxide (TiO), indium gallium zinc oxide (IGZO), and indium zinc tin oxide (IZTO).

In an embodiment, a plasma may be provided to process the second portion of the semiconductor pattern to form the source electrode and an electrode member that includes the drain electrode and the pixel electrode.

In an embodiment, the plasma may be provided during formation of the gate insulation pattern or after the formation of the gate insulation pattern.

In an embodiment, a passivation layer may be formed to cover the source electrode, the drain electrode, and the gate electrode.

In an embodiment, a hydrogen gas may be provided to the second portion of the semiconductor pattern to form the source electrode and an electrode member that includes the drain electrode and the pixel electrode during a chemical vapor deposition process that is performed for forming the passivation layer.

BRIEF DESCRIPTION OF THE DRAWINGS

The above and other features and advantages of the present invention will become more apparent by reference to the detailed description and the accompanying drawings, wherein.

DETAILED DESCRIPTION

Hereinafter, example embodiments of the present invention will be explained in detail with reference to the accompanying drawings. Although the terms first, second, etc. may be used herein to describe various signals, elements, components, regions, layers, and/or sections, these signals, elements, components, regions, layers, and/or sections should not be limited by these terms. These terms may be used to distinguish one signal, element, component, region, layer, or section from another signal, region, layer or section. Thus, a first signal, element, component, region, layer, or section discussed below may be termed a second signal, element, component, region, layer, or section without departing from the teachings of the present invention. The description of an element as a "first" element may not require or imply the presence of a second element or other elements. The terms first, second, etc. may also be used herein to differentiate different categories of elements. For conciseness, the terms first, second, etc. may represent first-type (or first-category), second-type (or second-category), etc., respectively.

Thin Film Transistor Substrate

Figure 1:
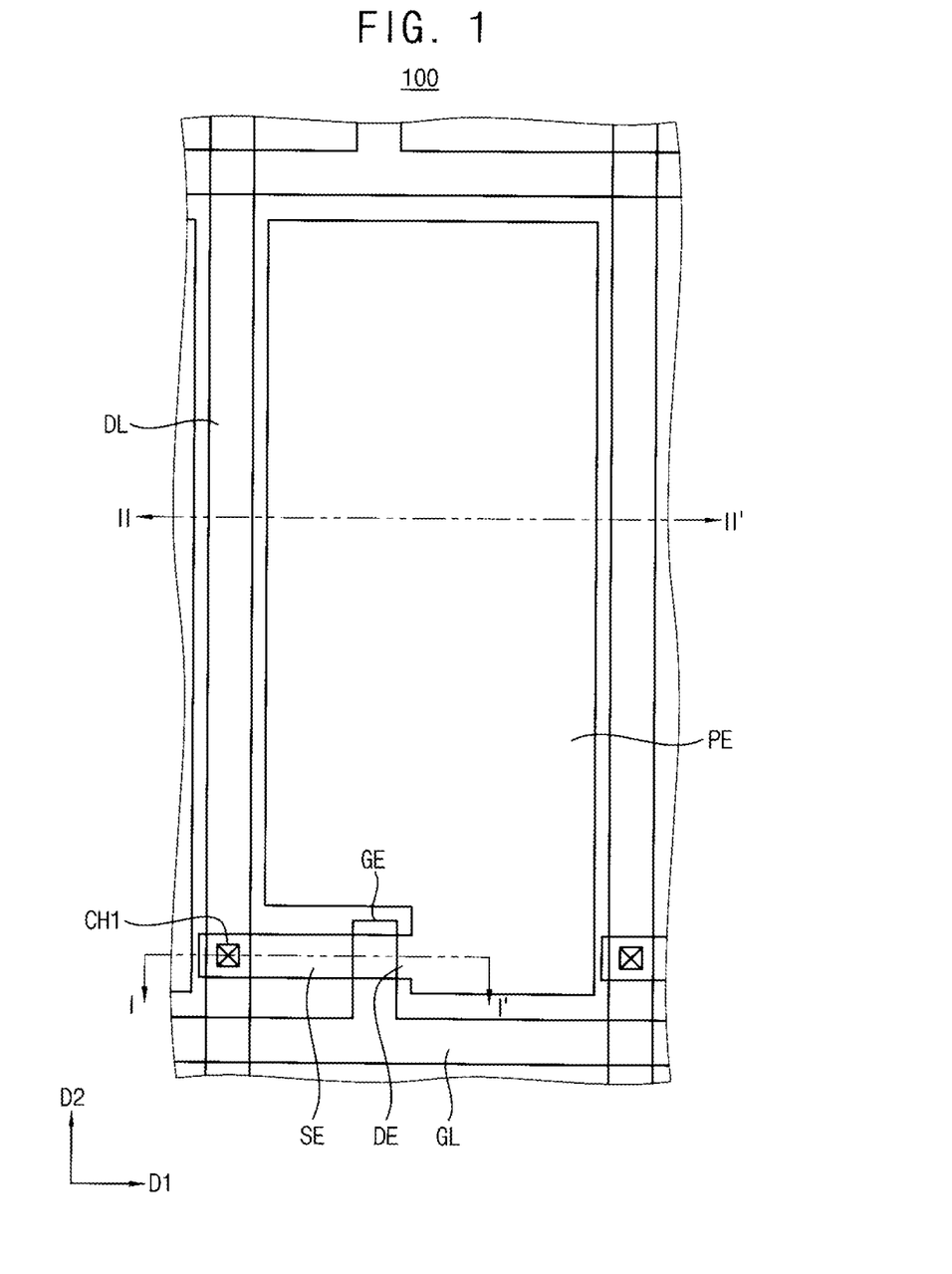
FIG. 1 is a (partial) plan view illustrating a thin film transistor substrate in accordance with one or more embodiments of the present invention.
Figure 2:
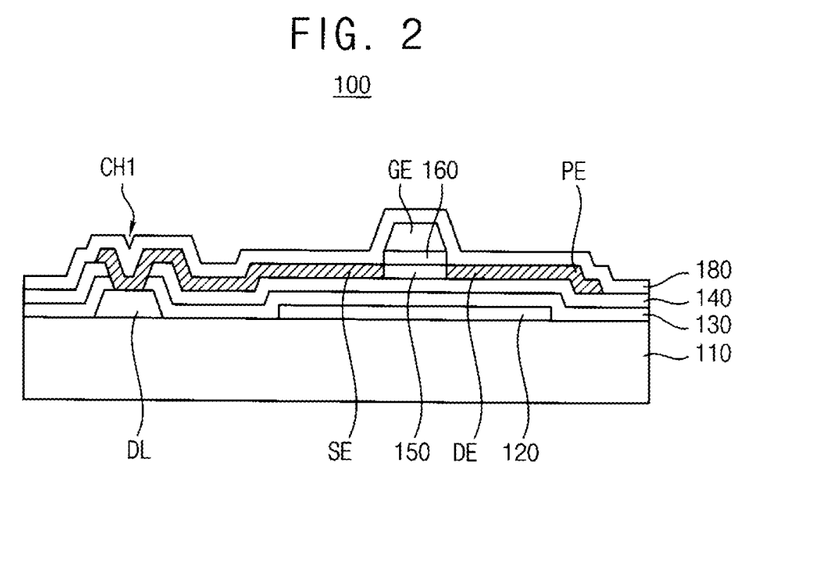
FIG. 2 is a cross-sectional view taken along a line I-I' indicated in FIG. 1.

FIG. 1 is a (partial) plan view illustrating a thin film transistor substrate 100 in accordance with one or more embodiments of the present invention. FIG. 2 is a cross-sectional view taken along a line I-I' indicated in FIG. 1.

Referring to FIGS. 1 and 2, the thin film transistor substrate 100 includes a base substrate 110, a gate line GL, a data line DL, a source electrode SE, a drain electrode DE, a channel 150, and a pixel electrode PE.

The gate line GL extends in a first direction D1 in the plan view of the thin film transistor substrate 100, and the data line DL extends in a second direction D2 crossing the first direction D1. For example, the first direction D1 may be substantially perpendicular to the second direction D2.

The gate line GL is electrically connected to the gate electrode GE. For example, the gate electrode GE may protrude from the gate line GL in the second direction D2.

The source electrode SE, the drain electrode DE, and the channel 150 are formed from a same layer of material and/or are continuously disposed in a same layer. The channel 150 is disposed between the source electrode SE and the drain electrode DE.

The channel 150 overlaps the gate electrode GE. In one or more embodiments, the gate electrode GE is disposed on the channel 150 such that the channel 150 is disposed between the gate electrode GE and the base substrate 110. A gate insulation pattern 160 is disposed between the gate electrode GE and the channel 150. The gate electrode GE may cover the entire front surface (or top surface illustrated in FIG. 2) of the channel 150.

In one or more embodiments, the thin film transistor substrate 100 further includes a pixel electrode PE electrically connected to the drain electrode DE. The pixel electrode PE is formed from the same layer of material as the drain electrode DE. Thus, the drain electrode DE may be substantially a portion of the pixel electrode PE; the pixel electrode PE may include the drain electrode DE. The drain electrode DE may be a protrusion of the pixel electrode PE.

In one or more embodiments, a size of the gate electrode GE may be equal to or greater than a size of the channel 150 in the plan view of the thin film transistor substrate. In one or more embodiments, the size of the gate electrode GE is greater than the size of the channel 150, the gate electrode GE extends parallel to the data line DL, and at least a portion of the gate electrode GE that does not overlap with the channel 150 may protrude in the second direction D2 with respect to the channel 150 and/or may protrude in a direction opposite to the second direction D2 with respect to the channel 150 in the plan view of the thin film transistor substrate. The data line DL is formed on the base substrate 110 and may directly contact the base substrate 110. The data line DL is electrically connected to the source electrode SE. A data insulation layer 130 is formed on the base substrate 110 to cover the data line DL.

The thin film transistor substrate 100 includes a light-blocking pattern 120 disposed in a same layer as the data line DL. The light-blocking pattern 120 may directly contact the base substrate 110. The light-blocking pattern 120 covers a lower surface of the channel 150 to prevent an external light from being incident into the channel 150 from the rear of the thin film transistor substrate 100. The light-blocking pattern 120 overlaps with an entire portion of the channel 150, the source electrode SE and the drain electrode DE, and an entire portion (e.g., entire back surface or bottom surface illustrated in FIG. 2) of the gate electrode GE. In one more embodiments, a protruding portion of the gate electrode GE does not overlap the channel 150 and protrudes beyond the channel 150 in the plan view of the thin film transistor substrate 100, and the light-blocking pattern 120 overlaps the protruding portion of the gate electrode GE as well as the channel 150. In one or more embodiments, the light-blocking pattern 120 may be larger than at least one of and/or the combination of the channel 150, the source electrode SE, and the drain electrode DE in the plan view of the thin film transistor substrate 100. In one or more embodiments, a buffer layer 140 is disposed between the light-blocking pattern 120 and the layer that includes the channel 150, the source electrode SE, and the drain electrode DE. The buffer layer 140 may protect one or more of the channel 150, the source electrode SE, and the drain electrode DE against potential contamination (e.g., caused by the material of the data insulation layer 130. In one or more embodiments, the light-blocking pattern 120 may be disposed on the buffer layer 140.

The channel 150, the source electrode SE, the drain electrode DE, and the gate electrode GE constitutes a thin film transistor. When a gate signal is applied to the gate electrode GE through the gate line GL, the channel 150 may become conductive. Thus, a data signal provided from the data line DL is applied to the pixel electrode PE through a first contact hole CH1, the source electrode SE, the channel 150, and the drain electrode DE, wherein the first contact hole CH1 is formed through the data insulation layer 130 and the buffer layer 140.

The thin film transistor substrate 100 includes a passivation layer 180. The passivation layer 180 covers the thin film transistor and the buffer layer 140.

Figure 3:
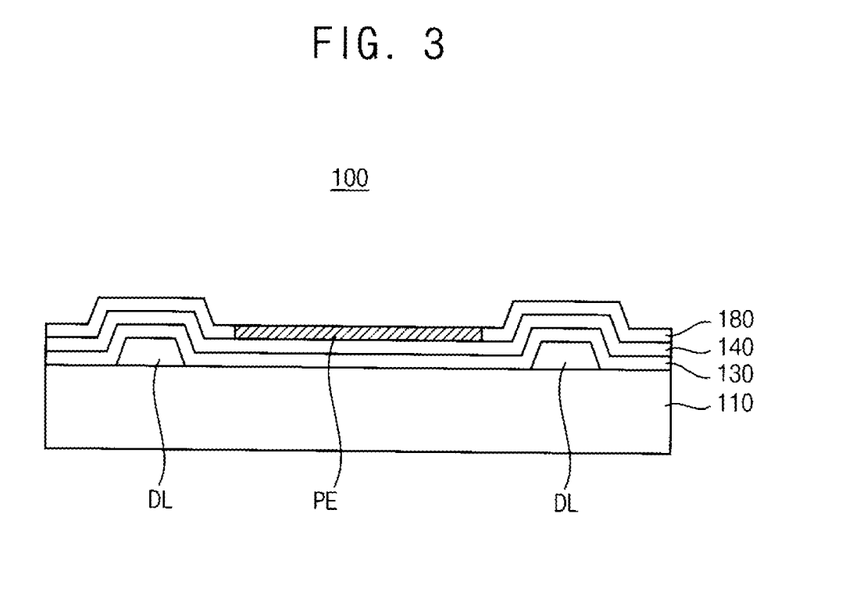
FIG. 3 is a cross-sectional view taken along a line II-II' indicated in FIG. 1.

Referring to FIG. 1 and FIG. 3, the pixel electrode PE is disposed between at least two data lines DL in the plan view of the thin film transistor substrate 100. The pixel electrode PE may be disposed in a same layer as the passivation layer 180 and may be disposed between two portions of the passivation layer 180. The passivation layer 180 includes an opening that exposes the pixel electrode PE. In one or more embodiment, the passivation layer 180 may be formed of a transparent material and may cover the pixel electrode PE.

A Method of Manufacturing a Thin Film Transistor Substrate

FIGS. 4 to 10 are cross-sectional views illustrating a method of manufacturing the thin film transistor substrate 100 illustrated in FIGS. 1 and 2.

Figure 4:
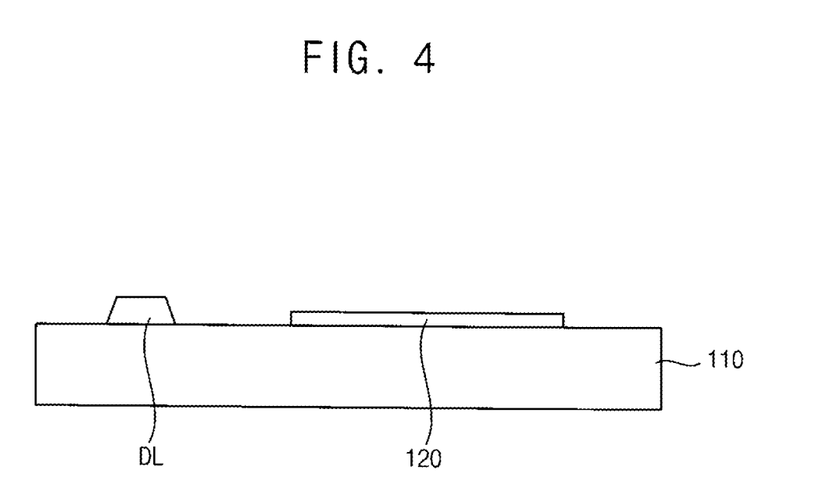
FIGS. 4 to 10 are cross-sectional views illustrating a method of manufacturing the thin film transistor substrate illustrated in FIG. 1.

Referring to FIG. 4, the data line DL and the light-blocking pattern 120 are formed on the base substrate 110. The base substrate 110 may include one or more of a glass substrate, a quartz substrate, a silicon substrate, a plastic substrate, etc.

A data metal layer is formed on the base substrate 110. The data metal layer is patterned using a photolithography process to form the data line DL.

A light-blocking layer is formed on the base substrate 110 and then patterned using a photolithography process to form the light-blocking pattern 120.

In one or more embodiments, the light-blocking pattern 120 may be formed before the formation of the data line DL. In one or more embodiments, the light-blocking pattern 120 may be formed after the formation of the buffer layer 140, wherein the buffer layer 140 may be disposed between the base substrate 110 and the light-blocking pattern 120.

The data line DL may include one or more of copper, silver, chromium, molybdenum, aluminum, titanium, and manganese. In one or more embodiments, the data line may include an alloy of some of the conductive materials. In one or more embodiments, the data line DL may have a single-layered structure. In one or more embodiments, the data line DL may have a multiple-layered structure that includes a plurality of metal layers having different materials. In one or more embodiments, the data line DL may include a copper layer and a titanium layer that overlaps the copper layer.

In one or more embodiments, the data line DL may include a metal layer and an oxide layer that overlaps the metal layer. For example, the data line DL may include a copper layer and an oxide layer that overlaps the copper layer. The oxide layer may include at least one of indium zinc oxide (IZO), indium tin oxide (ITO), gallium zinc oxide (GZO), and zinc aluminum oxide (ZAO).

The light-blocking pattern 120 may include at least one of a metal, an alloy, an inorganic insulation material, and an organic insulation material. In one or more embodiments, the light-blocking pattern 120 may include at least one of silicon-germanium alloy, germanium and titanium oxide. In one or more embodiments, the light-blocking pattern 120 includes silicon-germanium alloy (SiGe).

The thickness of the light-blocking pattern 120 may be in a range from about 1000 Å to about 2,000 Å. If the thickness of the light-blocking pattern 120 is less than about 1000 Å, the light-blocking ability of the light-blocking pattern 120 may be insufficient. If the thickness of the light-blocking pattern 120 is more than about 2,000 Å, the light-blocking pattern may form a capacitance with the source electrode SE or the drain electrode DE, and the capacitance may cause signal delay.

In one or more embodiments, the light-blocking pattern 120 may include a silicon-germanium alloy that may have an amorphous phase. In one or more embodiments, the light-blocking pattern 120 may have a single-layered structure that includes a silicon-germanium alloy. In one or more embodiments, the light-blocking pattern 120 may have a multiple-layered structure that includes a silicon-germanium alloy layer and a germanium layer. The germanium layer may overlap the silicon-germanium alloy layer.

In one or more embodiments, the light-blocking pattern 120 may be formed from the data metal layer and may be formed when the data line DL is formed. Thus, an additional deposition process and an additional mask may not be needed for forming the light-blocking pattern 120.

Figure 5:
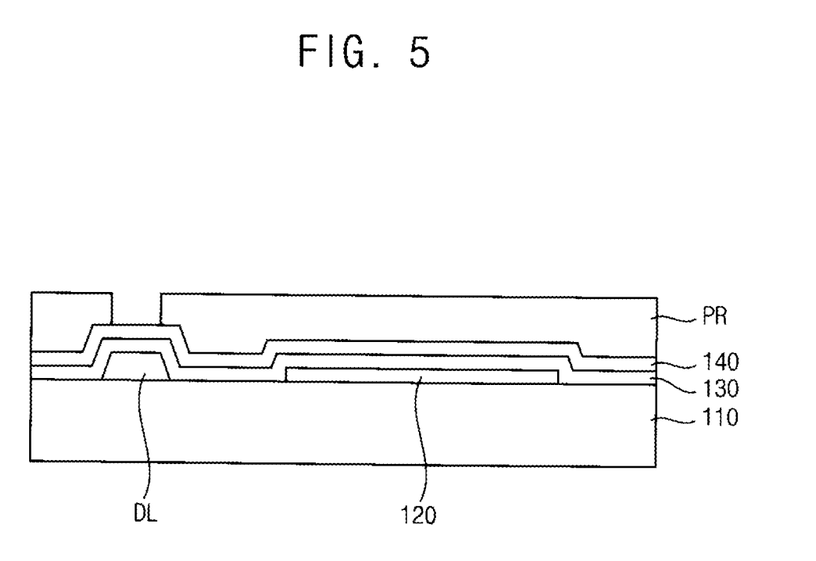

Referring to FIG. 5, a data insulation layer 130 and a buffer layer 140 are sequentially formed on the base substrate 110, the data line DL, and the light-blocking pattern 120.

The data insulation layer 130 covers the data line DL to provide electrical insulation. The data insulation layer 130 may include at least one of silicon oxide, silicon nitride, etc.

The buffer layer 140 is formed on the data insulation layer 130. The buffer layer 140 may include an insulation oxide, such as at least one of silicon oxide, aluminum oxide, hafnium oxide, yttrium oxide, etc. The thickness of the buffer layer 140 may be less than or equal to about 2,000 Å.

Figure 6:
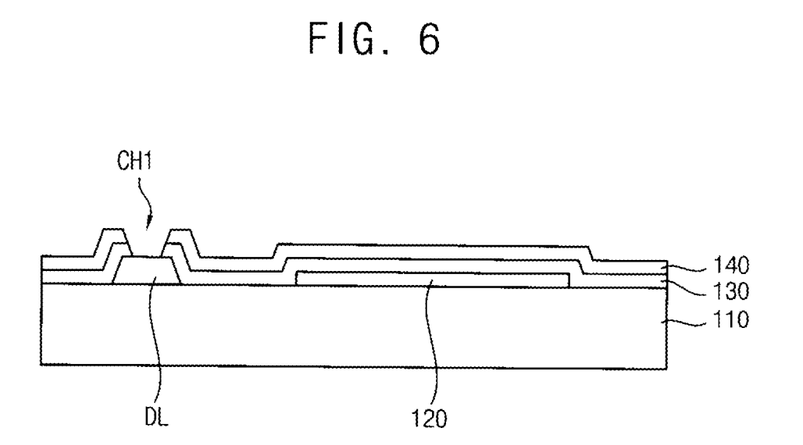

Referring to FIGS. 5 and 6, the buffer layer 140 and the data insulation layer 130 are patterned using a photolithography process to form a contact hole CH1. A photoresist pattern PR is formed on the buffer layer 140 to expose a desired portion of the buffer layer 140 that overlaps a desired portion of the data line DL. The buffer layer 140 and the data insulation layer 130 are etched using the photoresist pattern PR as a mask to form the first contact hole CH1 that exposes the desired portion of the data line DL.

Figure 7:
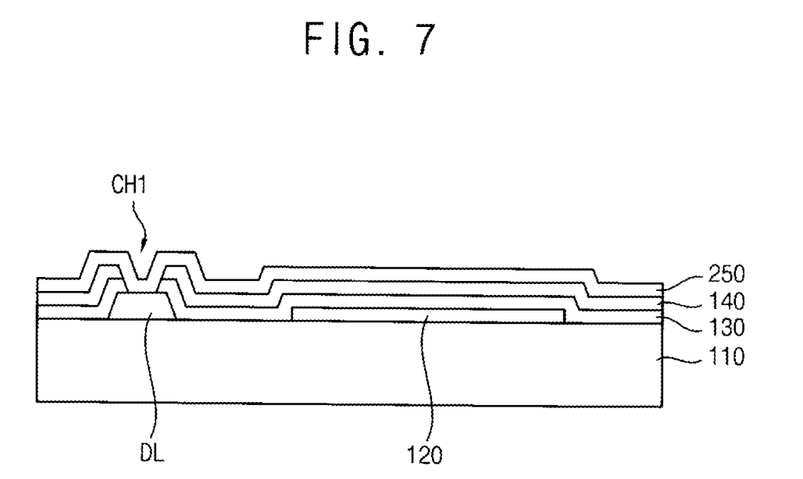

Referring to FIG. 7, a semiconductor layer 250 is formed on the buffer layer 140. The semiconductor layer 250 may include at least one of polysilicon, an oxide semiconductor, etc. In one or more embodiments, the semiconductor layer 250 includes an oxide semiconductor.

The oxide semiconductor may be a metal oxide semiconductor. For example, the oxide semiconductor may include at least one of zinc, indium, gallium, tin, titanium, phosphor, etc. These materials may be used alone or in combination according to particular embodiments. In one or more embodiments, the metal oxide semiconductor may include at least one of zinc oxide (ZnO), zinc tin oxide (ZTO), zinc indium oxide (ZIO), indium oxide (InO), titanium oxide (TiO), indium gallium zinc oxide (IGZO), and indium zinc tin oxide (IZTO).

A portion of the semiconductor layer 150 contacts with the data line DL through the first contact hole CH1.

One or more of the data insulation layer 130, the light-blocking layer for forming the light-blocking pattern 120, the buffer layer 140, and the semiconductor layer 250 may be formed using one or more of a chemical vapor deposition (CVD) process, a plasma enhanced chemical vapor deposition (PECVD) process, a solution coating process, a sputtering process, etc., according to the materials of the layers.

Figure 8:
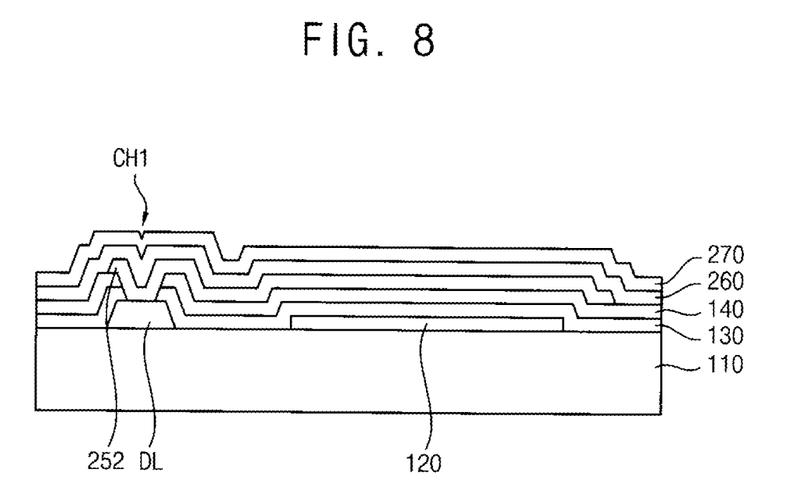

Referring to FIGS. 7 and 8, the semiconductor layer 250 is patterned to from a semiconductor pattern 252. In one or more embodiments, a photoresist pattern PR (analogous to the photoresist pattern PR illustrated in FIG. 5) is formed on the semiconductor layer 250, and the semiconductor layer 250 is etched using the photoresist pattern PR as a mask to form the semiconductor pattern 252.

A portion of the semiconductor pattern 252 (directly) contacts the data line DL through the first contact hole CH1.

Referring to FIG. 8, a gate insulation layer 260 and a gate metal layer 270 are formed on at least a portion of the semiconductor pattern 252 and at least a portion of the buffer layer 140.

The gate insulation layer 260 covers the semiconductor pattern 252. The gate insulating layer 260 may include at least one of silicon oxide, silicon nitride, etc. The thickness of the gate insulation layer 260 may be in a range of about 1000 Å to about 2,000 Å.

The gate metal layer 270 is formed on the gate insulation layer 260. The gate metal layer 270 may include one or more of copper, silver, chromium, molybdenum, aluminum, titanium, manganese, etc.; the gate metal layer 270 may include an alloy of some of the materials. In one or more embodiments, the gate metal layer 270 may have a single-layered structure. In one or more embodiments, the gate metal layer 270 may have a multiple-layered structure that includes a plurality of metal layers having different materials. For example, the gate metal layer 270 may include a copper layer and a titanium layer that overlaps the copper layer.

In one or more embodiments, the gate metal layer 270 may include a metal layer and an oxide layer that overlaps the metal layer. For example, the gate metal layer 270 may include a copper layer and an oxide layer that overlaps the copper layer. The oxide layer may include at least one of indium zinc oxide, indium tin oxide, gallium zinc oxide, and zinc aluminum oxide.

Figure 9:
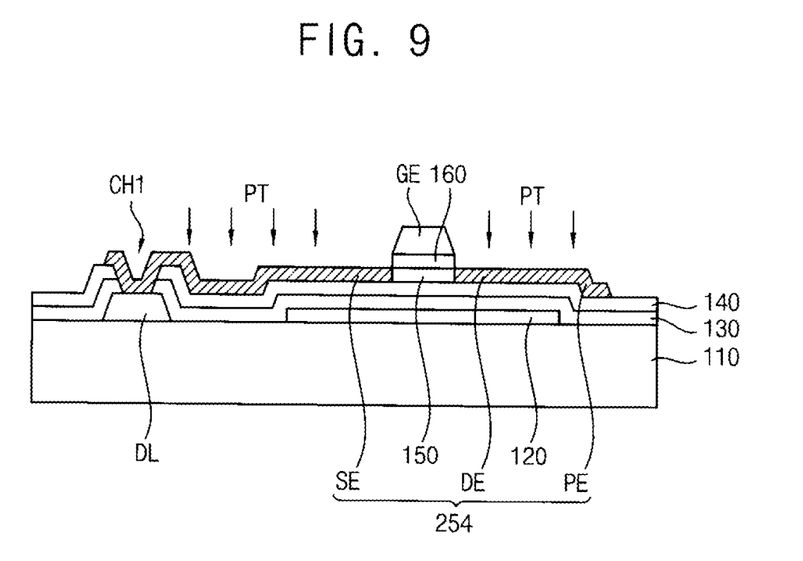

Referring to FIG. 9, a gate electrode GE, a gate line GL (not explicitly shown in FIG. 9 but formed when the gate electrode GE is formed), and a gate insulation pattern 160 are formed.

The gate insulation layer 260 is patterned to form a gate insulation pattern 160 on a portion of the semiconductor pattern 252. The gate insulation pattern 160 has a shape substantially the same as the gate electrode GE and the gate line GL in a plan view of the structure that includes the gate insulation pattern 160 (and in the plan view of the completed thin film transistor substrate 100). The gate metal layer 270 is patterned to form the gate electrode GE and the gate line GL on the gate insulation pattern 160.

When the gate insulation layer 260 is patterned, the semiconductor pattern 252 is exposed. Nevertheless, since the gate insulation layer 260 includes a material different from the material of the semiconductor pattern 252, the gate insulation layer 260 may have an etching selectivity with respect to the semiconductor pattern 252; as a result, the semiconductor pattern 252 is not substantially etched.

Referring to FIG. 9, a channel 150, a source electrode SE, and an electrode member that includes a drain electrode DE and a pixel electrode PE are formed from the semiconductor pattern 252. Particularly, exposed portions of the semiconductor pattern 252 that are not covered by the gate electrode GE and the gate insulation pattern 160 are processed and changed into the source electrode SE and the electrode member that includes the drain electrode DE and the pixel electrode PE. The pixel electrode PE may be seen as extending from the drain electrode DE and/or as including the drain electrode DE.

In one or more embodiments, the semiconductor pattern 252 may be plasma-treated to form the source electrode SE and the electrode member that includes the drain electrode DE and the pixel electrode PE. For example, exposed portions of the semiconductor pattern 252 are processed with a plasma gas PT that includes one or more of $H_2$, He, $PH_3$, $NH_3$, $SiH_4$, $CH_4$, $C_2H_2$, $B_2H_6$, $CO_2$, $GeH_4$, $H_2Se$, $H_2S$, Ar, $N_2$, $N_2O$, $CHF_3$, etc. Accordingly, at least a portion of a semiconductor material included in the semiconductor pattern 252 is converted to form a conductive material layer, that is, a (metallic) conductor 254. As a result, the conductive material layer, that is, the converted portions of the semiconductor pattern 252 may form the source electrode SE and the electrode member that includes the drain electrode DE and the pixel electrode PE. The remaining portion of the semiconductor pattern 252, which is covered by the gate electrode GE and the gate insulation pattern 160, remains a semiconductor to function as the channel 150.

In one or more embodiments, the semiconductor pattern 252 may be heated in a processing gas at an atmosphere to form the source electrode SE, the drain electrode DE, and the pixel electrode PE. In one or more embodiments, an ion-implanting process may be performed on the semiconductor pattern 252 to form the source electrode SE, the drain electrode DE, and the pixel electrode PE.

In one or more embodiments, after the gate insulation layer 260 has been dry etched, a plasma process may be performed to form the source electrode SE, the drain electrode DE, and the pixel electrode PE. Alternatively, after the gate insulation pattern 160 has been formed, an extra plasma process that includes providing a plasma gas may be performed, to form the source electrode SE, the drain electrode DE, and the pixel electrode PE.

In one or more embodiments, a process that includes providing a hydrogen gas to an exposed portion of the semiconductor pattern 252 may be performed in a chemical vapor deposition process for forming a passivation layer 180 (illustrated in FIG. 10) that covers the gate electrode GE and the exposed portion of the semiconductor pattern 252. Thus, a metal, such as indium, may precipitate to form the source electrode SE, the drain electrode DE, and the pixel electrode PE.

Figure 10:
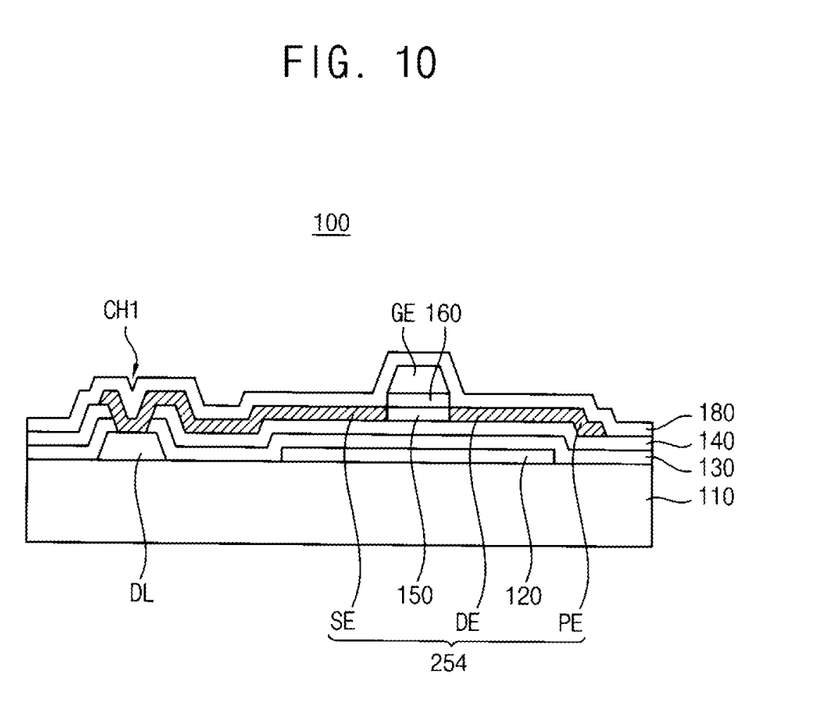

Referring to FIG. 10, a passivation layer 180 is formed to cover the buffer layer 140, the gate electrode GE, the source electrode SE and the drain electrode DE. The passivation layer 180 may include at least one of silicon oxide, silicon nitride, etc.

In one or more embodiments, the passivation layer 180 is patterned to expose the pixel electrode PE, as illustrated in the FIG. 3.

In one or more embodiments, while an etching process is performed on the passivation layer 180 to form an opening that exposes the pixel electrode PE, an etch gas may be provided to the pixel electrode PE. Alternatively, after the etching process is performed, a plasma process may be performed on the pixel electrode PE.

As can be appreciated from the description provided above, the source electrode SE of a pixel (directly) contacts the data line DL through the contact hole CH1. The pixel electrode PE is formed in a same layer as the source electrode SE and the drain electrode DE; therefore, the pixel may not need any additional contact holes. According to embodiments of the invention, only one contact hole may be required for connecting the data line DL with the pixel. Advantageously, the aperture ratio of the pixel may be sufficiently large, and the pixel may display an image with satisfactory quality In one or more embodiments, a pixel electrode PE is formed in a same layer as a source electrode SE and a drain electrode DE. Accordingly, the number of masks required to manufacture a thin film transistor may be minimized. Advantageously, the manufacturing time and manufacturing cost may be minimized.

A thin film transistor substrate according to one or more embodiments of the present invention may be used for an array substrate of a display device. In one or more embodiments, the thin film transistor substrate may be used in one or more of a liquid crystal display device, an organic EL display device, a circuit substrate having a thin film transistor, a semiconductor device, etc.

It is readily apparent to those of reasonable skill in the art that various modifications may be made without departing from the spirit and scope of the invention, which is defined by the metes and bounds of the appended claims.

What is claimed is:

1. A thin film transistor substrate comprising:
    a base substrate;
    a data line disposed on the base substrate and configured to transmit a data signal;
    a source electrode contacting the data line;
    a drain electrode spaced from the source electrode;
    a channel disposed between the source electrode and the drain electrode;
    a pixel electrode electrically connected to the drain electrode;
    a gate insulation pattern disposed on the channel, wherein a width of the channel is substantially equal to a width of the gate insulation pattern, and wherein the width of the gate insulation pattern is equal to a distance between a first flat side of the gate insulation pattern and a second flat side of the gate insulation pattern; and
    a gate electrode disposed on the gate insulation pattern, wherein a first flat side of the gate electrode is directly connected to the first flat side the gate insulation pattern and is oblique with respect to the first flat side the gate insulation pattern.

2. The thin film transistor substrate of claim 1, wherein the source electrode, the drain electrode, the pixel electrode, and the channel are each formed of at least one of zinc oxide (ZnO), zinc tin oxide (ZTO), zinc indium oxide (ZIO), indium oxide (InO), titanium oxide (TiO), indium gallium zinc oxide (IGZO), and indium zinc tin oxide (IZTO).

3. The thin film transistor substrate of claim 1, further comprising a gate line electrically connected to the gate electrode and configured to transmit a gate signal, wherein the gate electrode extends parallel to the data line.

4. The thin film transistor substrate of claim 1, further comprising:
    a light-blocking pattern disposed between the channel and the base substrate; and
    a buffer layer disposed between the light-blocking pattern and the channel,
    wherein the source electrode and the data line are directly connected to each other through a contact hole of the buffer layer.

5. The thin film transistor substrate of claim 4, wherein the data line and the light-blocking pattern are disposed in a same layer.

6. The thin film transistor substrate of claim 4, wherein the light-blocking pattern comprises at least one of silicon-germanium alloy, germanium, and titanium oxide.

7. The thin film transistor substrate of claim 4, wherein the thickness of the light-blocking pattern is in a range of about 1000 Å to about 2,000 Å.

8. The thin film transistor substrate of claim 1, further comprising a passivation layer formed in a same layer as the pixel electrode, wherein the passivation layer comprises an opening through which at least a portion of the pixel electrode is exposed.

* * * * *